(12) United States Patent
Chan et al.

(10) Patent No.: US 8,785,988 B1
(45) Date of Patent: Jul. 22, 2014

(54) N-CHANNEL METAL-OXIDE FIELD EFFECT TRANSISTOR WITH EMBEDDED HIGH VOLTAGE JUNCTION GATE FIELD-EFFECT TRANSISTOR

(71) Applicant: Macronix International Co., Ltd., Hsin-Chu (TW)

(72) Inventors: Wing-Chor Chan, Hsinchu (TW); Li-Fan Chen, Hsinchu (TW); Chen-Yuan Lin, Taitung (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 13/740,006

(22) Filed: Jan. 11, 2013

(51) Int. Cl.
*H01L 29/66* (2006.01)
*H01L 27/07* (2006.01)

(52) U.S. Cl.
CPC ................................ *H01L 27/0705* (2013.01)
USPC ........................................................ 257/262

(58) Field of Classification Search
CPC .................................................. H01L 27/0705

USPC ............................................................ 257/262
See application file for complete search history.

(56) References Cited

U.S. PATENT DOCUMENTS 5,323,028 A * 6/1994 Nishizawa et al. ........... 257/136

* cited by examiner

*Primary Examiner* — Zandra Smith
*Assistant Examiner* — Paul Patton
(74) *Attorney, Agent, or Firm* — Alston & Bird LLP

(57) ABSTRACT

A semiconductor device comprising a high-voltage (HV) n-type metal oxide semiconductor (NMOS) embedded HV junction gate field-effect transistor (JFET) is provided. An HV NMOS with embedded HV JFET may include, according to a first example embodiment, a substrate, an N-type well region disposed adjacent to the substrate, a P-type well region disposed adjacent to the N-type well region, and first and second N+ doped regions disposed adjacent to the N-type well and on opposing sides of the P-type well region. The P-type well region may comprise a P+ doped region, a third N+ doped region and a gate structure, the third N+ doped region being interposed between the P+ doped region and the gate structure.

20 Claims, 15 Drawing Sheets

N-CHANNEL METAL-OXIDE FIELD EFFECT TRANSISTOR WITH EMBEDDED HIGH VOLTAGE JUNCTION GATE FIELD-EFFECT TRANSISTOR

TECHNOLOGICAL FIELD

Embodiments of the present invention generally relate to semiconductor devices and, more particularly, relate to an n-channel metal-oxide field effect transistor (NMOS) comprising an embedded high-voltage junction gate field-effect transistor (JFET).

BACKGROUND

High Voltage processes have been widely used for power management integrated circuits (PMIC) and switch-mode power supplies (SMPS), both of which are commonly used as LED drivers.

In recent years, interest in efficient "green" electronic devices has steadily increased, driving device manufacturers to seek higher conversion efficiencies and lower standby power consumption. Switch mode power ICs require an integrated start-up circuit and pulse width modulation (PWM) circuit. Unfortunately, conventional high voltage start-up circuits use a power resistor approach wherein power is continuously being dissipated by the power resistor after start-up. The power resistor is selected such that it will provide the charging current for the capacitor and the PWM circuit during start-up operation. The PWM circuit will continue to operate until its Vcc voltage falls below the minimum operating voltage rating, at which point an auxiliary voltage is applied to the Vcc of the PWM circuit. The PWM circuit is normal operation between 5V~30V.

A further development in recent year is the use of power line voltage (i.e., AC100~240V) in LED driver ICs to drive LED. These LED driver ICs conventionally use buck converters and include high voltage switch type NMOS to provide current to drive the LED. Conventional solutions also use high voltage depletion MOS to provide reference voltage or power to supply the internal circuit. However, high voltage depletion MOS require extra circuit area and an extra mask to form. Thus, there is a need for an alternative to existing conventional solutions.

BRIEF SUMMARY OF EXEMPLARY EMBODIMENTS

Some example embodiments are therefore directed to an n-channel metal-oxide field effect transistor (NMOS or nMOSFET) comprising an embedded high-voltage junction gate field-effect transistor (JFET). In some cases, the NMOS embedded JFET may be provided at least in part based on modifications to a standard High Voltage (HV) process and may not require any additional masks or processes. In this way, embodiments of the present invention may provide a High Voltage JFET in a relatively small area by embedding the HV JFET in a source or drain edge of an NMOS using existing semiconductor device manufacturing procedures.

In one exemplary embodiment, a semiconductor device is provided which includes a P-type substrate, an N-type well region disposed adjacent to the substrate, a P-type well region disposed adjacent to the N-type well region, and first and second N+ doped regions disposed adjacent to the N-type well and on opposing sides of the first and second P-type well regions. The P-type well region comprises a P+ doped region, a third N+ doped region and a gate structure, the third N+ doped region being interposed between the P+ doped region and the gate structure.

According to a second exemplary embodiment, a semiconductor device is provided which includes a P-type substrate, an N-type well region disposed adjacent to the substrate, first and second P-type well regions disposed adjacent to the N-type well region, and a third P-type well region disposed adjacent to the N-type well region and the substrate. The N-type well region encompasses the first and second P-type well regions such that at least a portion of the N-type well region is interposed between the first and second, second and third, and first and third P-type well regions. The semiconductor device further comprises first and second N+ doped regions disposed adjacent to the N-type well and on opposing sides of the first and second P-type well regions. The third P-type well comprises a third P+ doped region, the second P-type well region comprises a second P+ doped region, and the first P-type well comprises a first P+ doped region, a third N+ doped region, and a gate structure, the third N+ doped region being interposed between the first P+ doped region and the gate structure. At least a portion of the first P-type well region is interposed between the first P+ doped region and the first N+ doped region.

According to a third exemplary embodiment, a semiconductor device is provided which includes a P-type substrate, an N-type well region disposed adjacent to the substrate, a first P-type well region disposed adjacent to the N-type well region, a second P-type well region disposed adjacent to the N-type well region and the substrate, and first and second N+ doped regions disposed adjacent to the N-type well region and on opposing sides of the first P-type well region. The N-type well region encompasses the first P-type well region such that at least a portion of the N-type well region is interposed between the first and second P-type well regions. The second P-type well comprises a second P+ doped region and the first P-type well region comprises a first P+ doped region, a third N+ doped region and a gate structure, the third N+ doped region being interposed between the P+ doped region and the gate structure. At least a portion of the second P-type well region is interposed between the first P+ doped region and the first N+ doped region.

The embodiments and characteristics referred to above, as well as additional details, of the present invention are described below, including corresponding and additional embodiments of NMOS with embedded JFET of the present invention are also described below.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Some example embodiments of the present invention will now be described more fully hereinafter with reference to the accompanying drawings, in which some, but not all embodiments of the invention are shown. Indeed, various example embodiments of the invention may be embodied in many different forms and should not be construed as limited to the example embodiments set forth herein; rather, these example embodiments are provided so that this disclosure will satisfy applicable legal requirements.

Some example embodiments of the present invention may provide an NMOS, such as a high voltage switch type NMOS, having an embedded JFET, such as a high voltage JFET. The JFET may, for example, be embedded at the source or drain edge area of the NMOS. The JFET of example embodiments may thus be provided in a relatively small area. Furthermore, the JFET of example embodiments may in some cases provide a breakdown voltage that is the same or nearly the same as a high voltage switch type NMOS. Example embodiments may use an N-type well to form the channel of the embedded JFET, e.g., NJFET. Example embodiments may allow the pinch-off voltage of the embedded JFET to be varied, such as, for example, by adjusting the spacing of the P-type well associated with the NMOS source or the high voltage N-type well (HVNW). Further example embodiments may allow characteristics of the linear and saturation regions to be altered by adjusting the width of the P-type well associated with the NMOS source. For example, the JFET's transition from the linear to saturation region can made more sharp, e.g., abrupt, be increasing the width of the P-type well.

Example embodiments may, in some cases, be fabricated at least in part using a standard high voltage (HV) process, such as without requiring the use of any additional masks or processes. Example embodiments may be fabricated using local oxidation of silicon (LOCOS) processes, shallow trench isolation (STI) processes, deep trench isolation (DTI) processes, silicone on insulator (SOI) processes, epitaxial (EPI) (e.g., N/P-EPI) processes, and/or non-EPI processes. The N channel of the embedded JFET, e.g., NJFET, may be embodied, for example, as an N-type well, an N-type drift layer, an N-type buffer layer, or and N-type deep well. The HV JFET according to example embodiments may be embedded in an HV NMOS of various structures, such as a circle structure HV NMOS or an ellipse structure HV NMOS. Example embodiments of the present invention may, in some cases, be applied to a current source or a voltage reducer. Certain example embodiments may be configured, such as by adjusting the HV JFET pinch-off voltage as discussed above, to supply between 5V and 30V of power to a pulse width modulation (PWM) circuit.

Figure 1A:
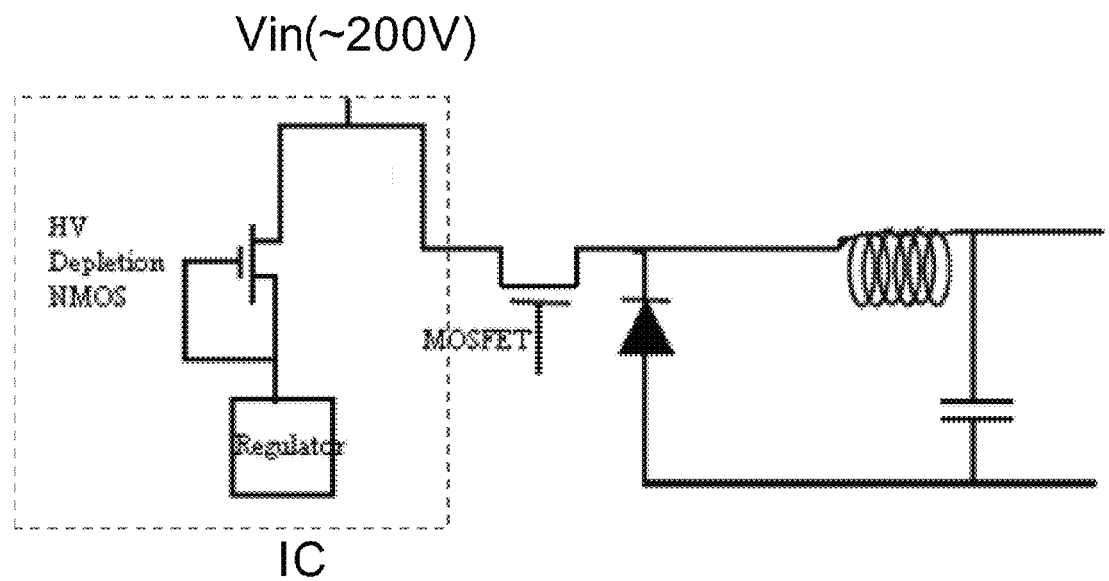
FIG. 1a illustrates a block diagram of a conventional buck converter circuit.
Figure 1B:
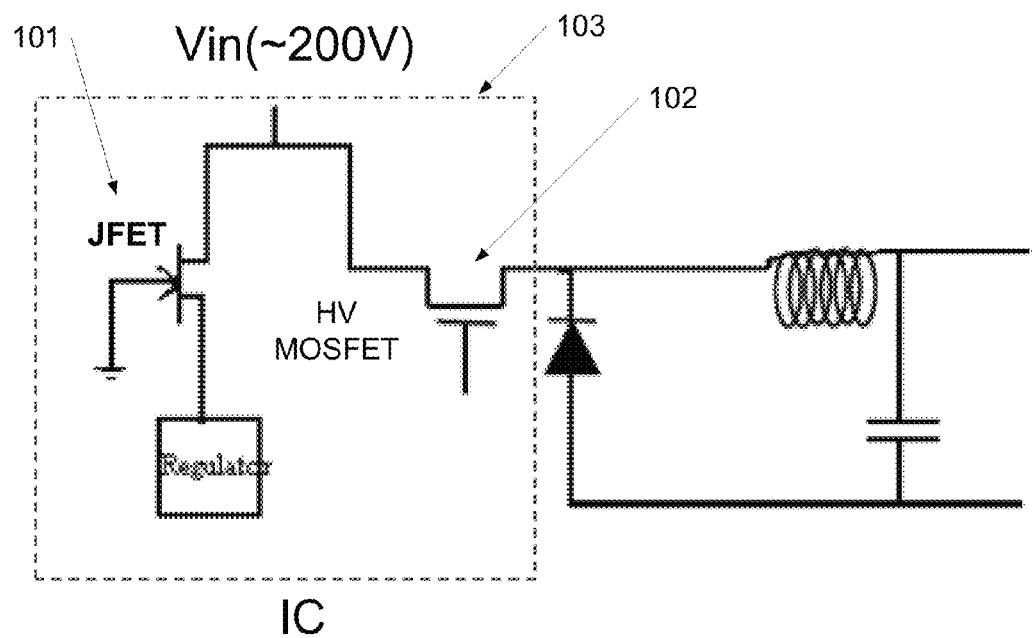
FIG. 1b illustrates a block diagram of an example embodiment.

FIG. 1a illustrates a block diagram of a conventional buck conversion circuit, such as may be used to drive an LED. As shown in FIG. 1a, the conventional buck conversion circuit requires a high voltage depletion NMOS to provide reference voltage or power to supply the internal circuit as well as a separate MOSFET to provide current to drive the load. Because the HV Depletion NMOS and HV MOSFET exist in separate integrated circuit (IC) packages, the overall size of the conventional buck conversion circuit may be relatively large. In comparison, FIG. 1b illustrates a block diagram of an example embodiment of the present invention, which provides a JFET 101 and HV NMOS 102 in a single IC package 103 by embedding the JFET 101 in the NMOS 102. Thus, the overall circuit maintains similar electrical properties as compared with the conventional buck conversion circuit depicted in FIG. 1a, but with a reduced footprint.

Turning now to FIGS. 2a through 6b, the structures of various example embodiments of the present invention will now be discussed.

Figure 2A:
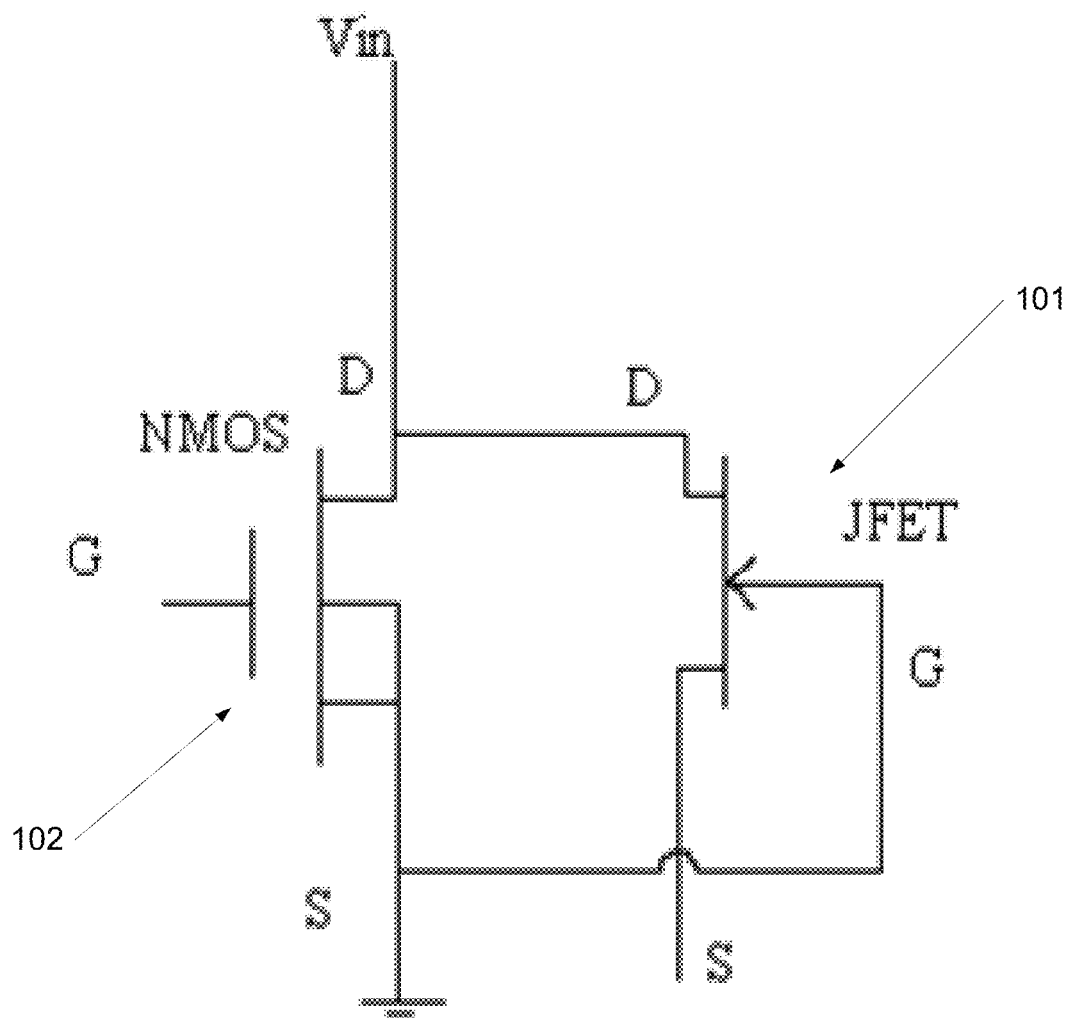
FIG. 2a illustrates an equivalent circuit representation in accordance with a first example embodiment of the present invention.
Figure 2B:
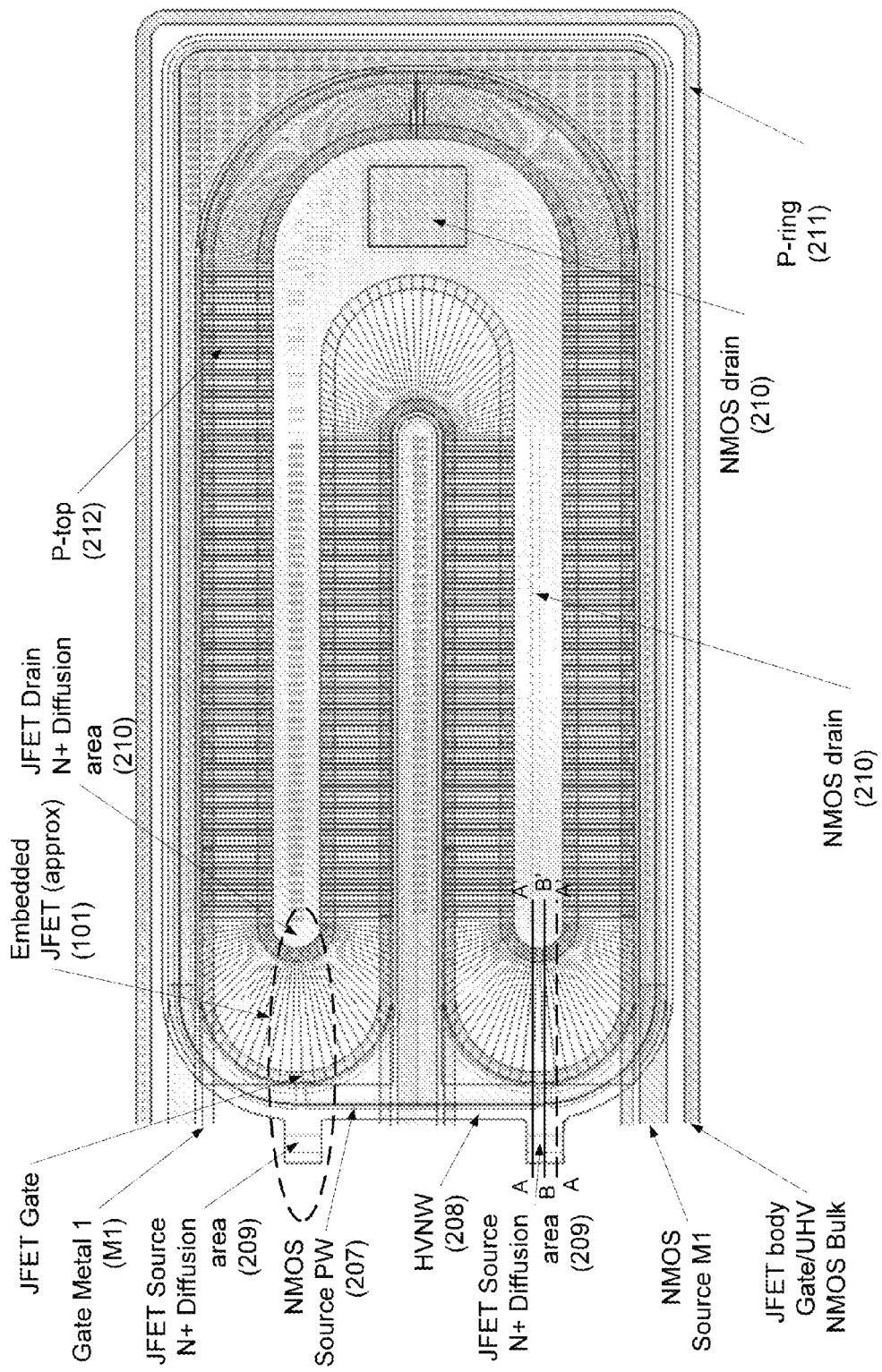
FIG. 2b illustrates a top view of a semiconductor device in accordance with the first example embodiment.

FIG. 2a depicts a block diagram of an equivalent circuit for a first example embodiment in which a gate (G) of the embedded JFET 101 is combined with a source (S) of the NMOS 102. FIG. 2b depicts a top view of an example layout of the first example embodiment in which the gate of the embedded JFET 101 is combined with the source of the NMOS 102. As shown, this example layout provides two embedded JFETs near the source end of an NMOS. The approximate location of one of the embedded JFETs 101 is encircled with a dashed line. To appreciate the structure of the embedded JFET 101 and how it fits with the structure of the NMOS, attention is now turned to FIG. 2c, in which two cross-sectional views taken along lines A-A' and B-B' of FIG. 2b are depicted. A cross sectional view taken below (from the perspective of the top view of FIG. 2b) the B-B' line may, according to some embodiments, be identical to a cross sectional view taken along the A-A' line, as indicated by the second dashed A-A' line. According to such embodiments, the distance between the P-type well region 207 through which the solid A-A' line runes and the P-type well region 207 through which the dashed A-A' line runs may be adjusted in order to adjust the pinch-off voltage of the embedded JFET 101. However, the cross sectional views may not be identical according to structures of other example embodiments.

Figure 2C:
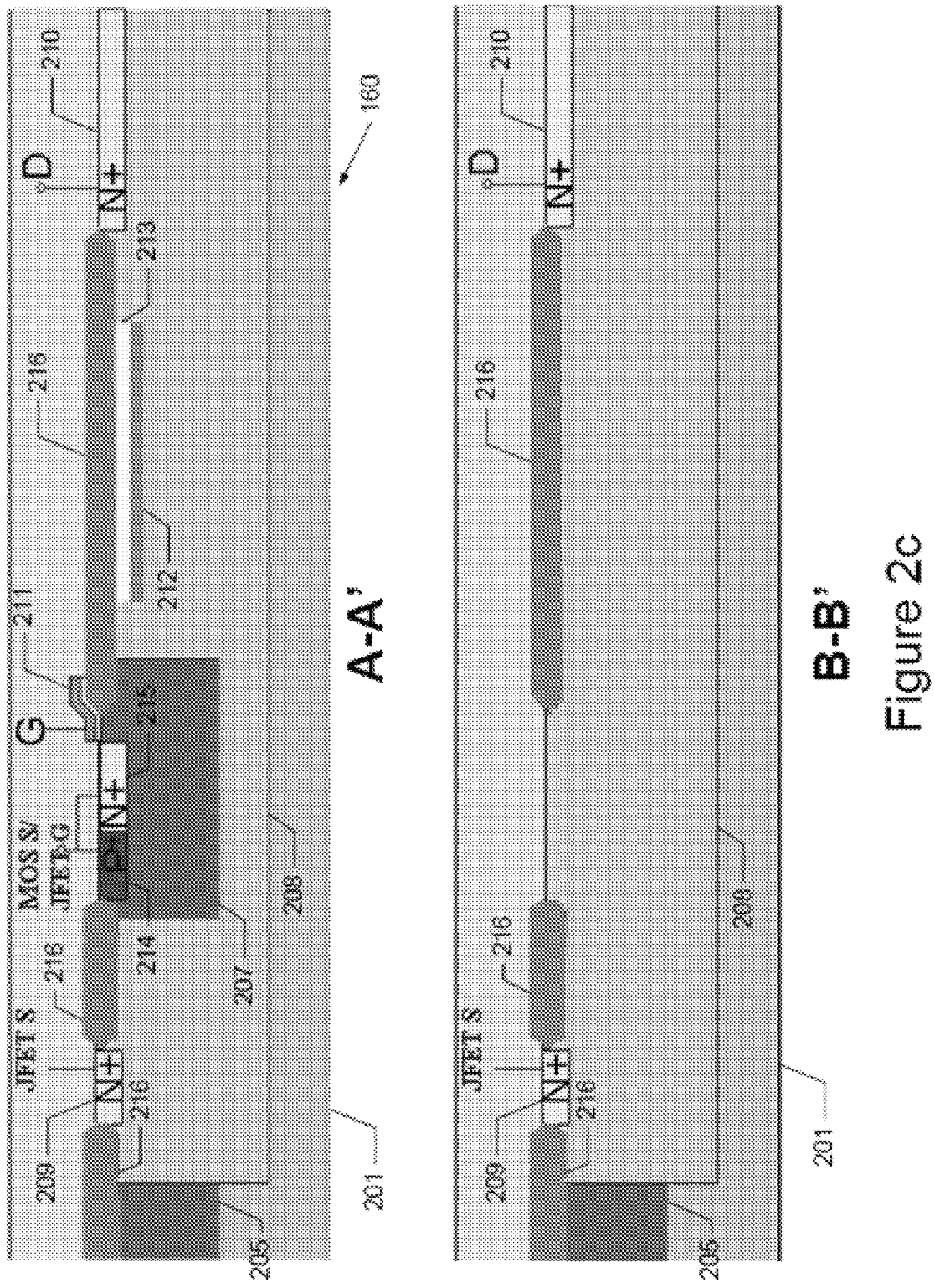
FIG. 2c illustrates two cross-sectional views of the semiconductor device depicted in FIG. 2b, taken along the lines A-A' and B-B'.

As can be seen from the cross-sectional view along line A-A' in FIG. 2c, a P-type material substrate 201 may be provided with an N-type region 208, such as a high voltage N-type well (HVNW) region, disposed thereon according to the depicted example embodiment. A P-type well region 207 may be disposed adjacent to the N-type well region 208. It will be appreciated by comparing the cross-sectional views along both A-A' lines with the B-B' cross-sectional view in the context of the top view depicted in FIG. 2b, that a second P-type well region may further be disposed adjacent to the N-type well region according to an example embodiment.

The N-type well region 208 may thus encompass the first and second P-type well regions 207 such that at least a portion of the N-type well region 208 is interposed between the first and second P-type well regions 207. As further shown in FIG. 2c, first and second N+ doped regions 209, 210 may be disposed adjacent to the N-type well region 208 and on opposing sides of the P-type well region 207. As shown, the first N+ doped region 209 corresponds to a source of the embedded JFET 101 while the second N+ doped region 210 corresponds to a drain of both the embedded JFET 101 and the NMOS 102. As further shown in FIG. 2c, the P-well region 207 may comprise a P+ doped region 214, a third N+ doped region 215, and a gate structure 211, the third N+ doped region 215 being interposed between the P+ doped region 214 and the gate structure 211. The gate structure 211 may enable collective operation of the third N+ doped region 215 and P+ doped region 214 which, as shown, collectively correspond to both a source of the NMOS 102 and a gate of the embedded JFET 101.

Field-oxide portions (FOXs) 216 may be further disposed adjacent to the N-type well region 208. For example, a first FOX portion may be disposed adjacent to a distal end of the first N+ doped region 209, a second FOX portion may be interposed between a distal end of the first N+ doped region 209 and a distal end of the P+ doped portion 214, and a third FOX portion may be interposed between the P-type well and a distal end of the second N+ doped region 210 and further interposed between the gate structure 211 and the P-type well 207. An additional P-type well region 205 may also be further disposed adjacent to the N-type well region 208 and interposed between the first FOX portion 216 and the P-type substrate. An N-type layer 213 and P-top portion 212 may also be further disposed adjacent to the N-type well region 208, the N-type layer 213 being interposed between the third Fox portion 216 and the P-top portion 212.

Figure 3A:
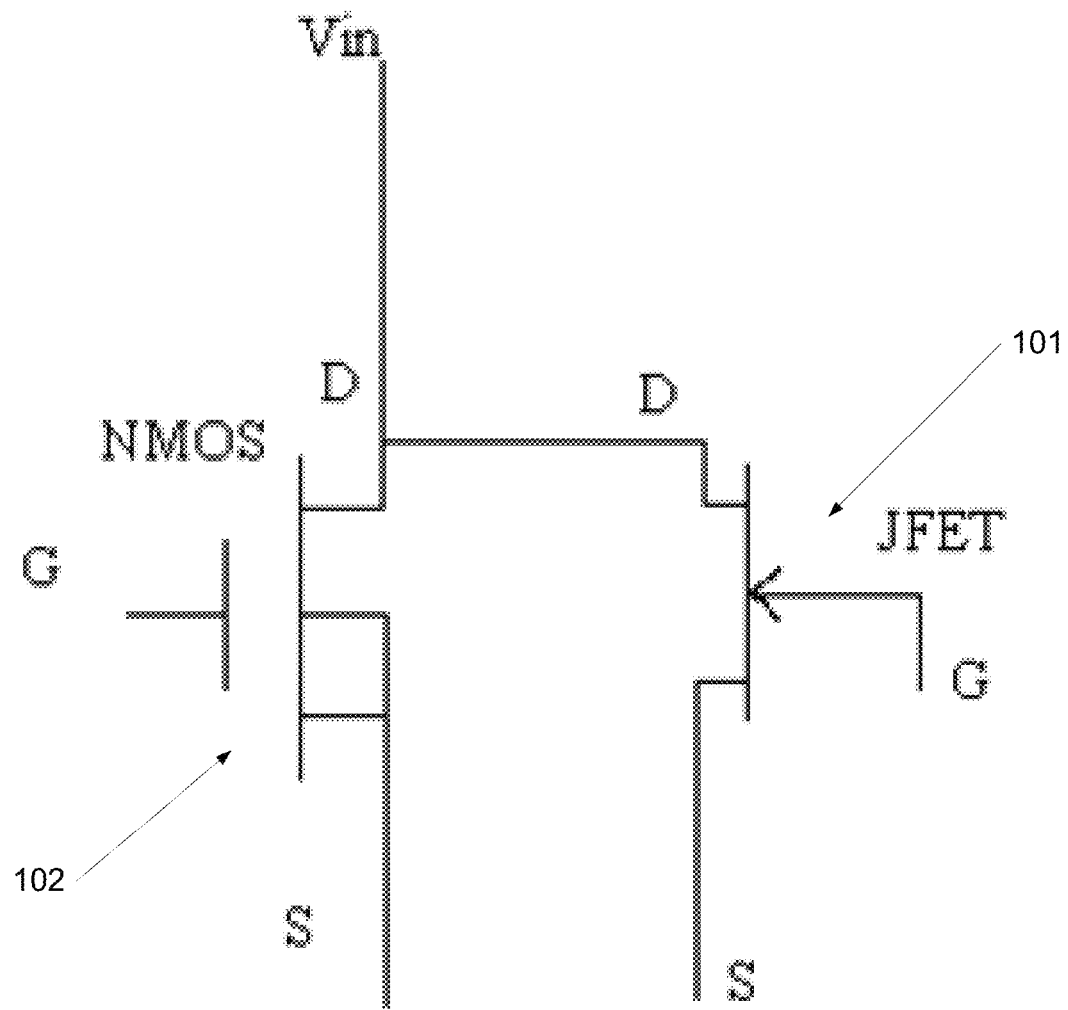
FIG. 3a illustrates an equivalent circuit representation in accordance with a second example embodiment of the present invention.
Figure 3B:
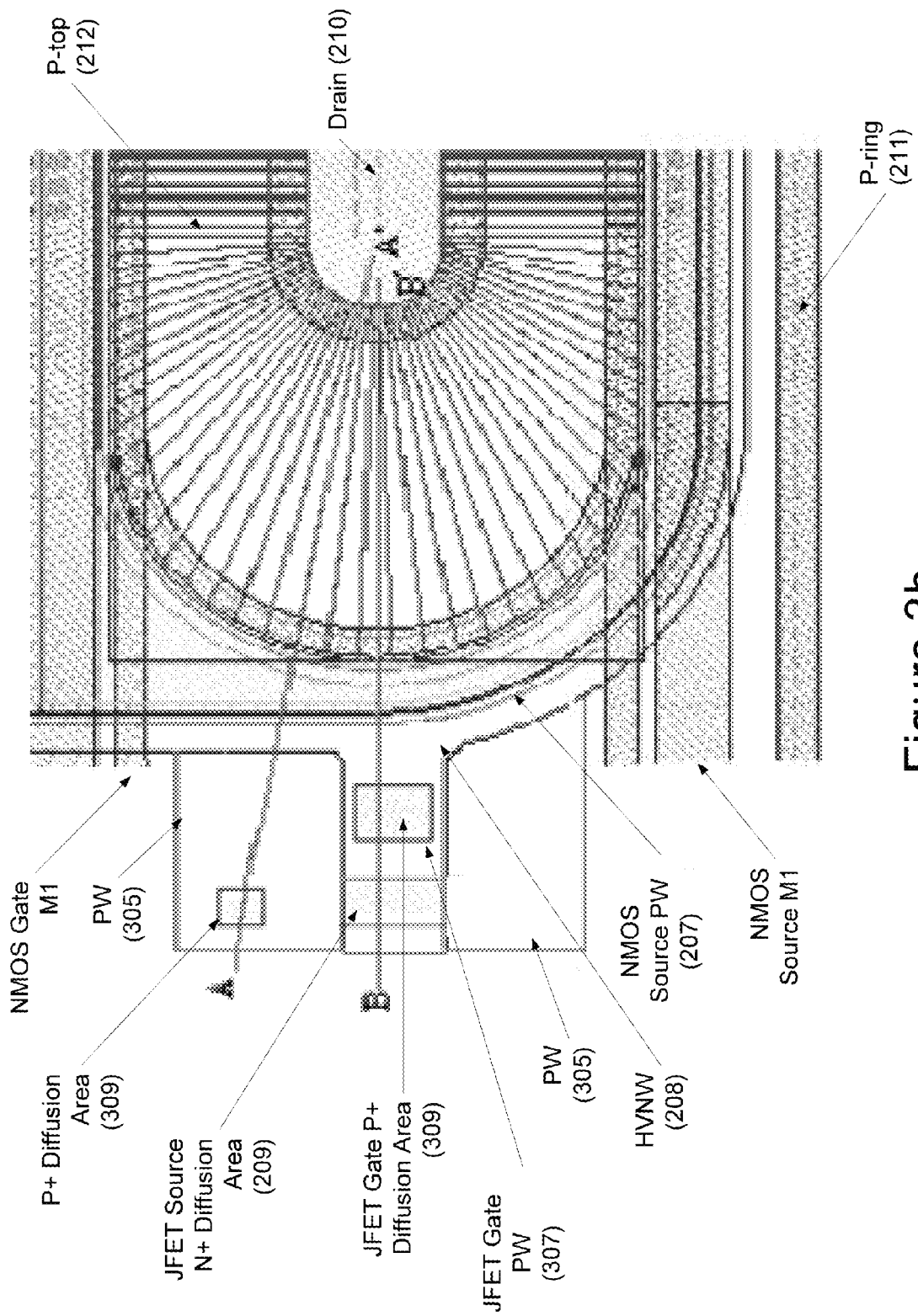
FIG. 3b illustrates a top view of a semiconductor device in accordance with the second example embodiment.

FIG. 3a depicts a block diagram of an equivalent circuit for a second example embodiment in which a gate (G) of the embedded JFET 101 is isolated. FIG. 3b depicts a top view of an example layout of the second example embodiment in which the gate of the embedded JFET 101 is isolated. Although only half of the NMOS 102 is shown in FIG. 3b, this example layout may also provide two embedded JFETs near the source end of the NMOS 102. To appreciate the structure of the embedded JFET 101 and how it fits with the structure of the NMOS, attention is now turned to FIG. 3c, in which two cross-sectional views taken along lines A-A' and B-B' of FIG. 3b are depicted.

Figure 3C:
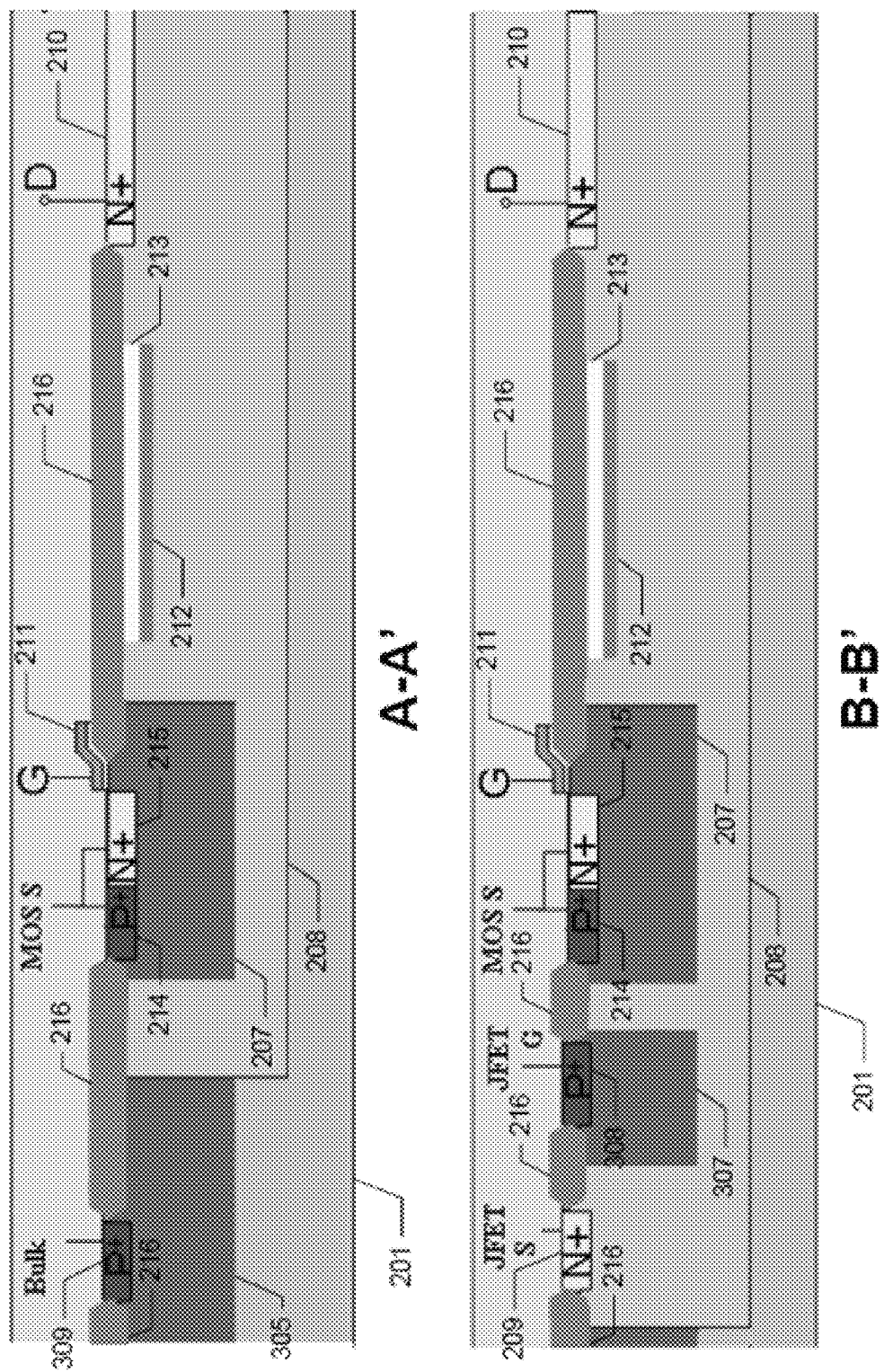
FIG. 3c illustrates two cross-sectional views of the semiconductor device depicted in FIG. 3b, taken along the lines A-A' and B-B'.

As can be seen from the cross-sectional view along line B-B' in FIG. 3c, a P-type material substrate 201 may be provided with an N-type region 208 disposed thereon according to the depicted example embodiment. As with the first embodiment depicted in FIG. 2c, a first P-type well region 207 may disposed adjacent to the N-type well region 208 and first and second N+ doped regions 209, 210 may be disposed adjacent to the N-type well region 208 and on opposing sides of the P-type well region 207. As shown, the first N+ doped region 209 corresponds to a source of the embedded JFET 101 while the second N+ doped region 210 corresponds to a drain of both the embedded JFET 101 and the NMOS 102. As further shown in FIG. 2c, the first P-well region 207 may comprise a first P+ doped region 214, a third N+ doped region 215, and a gate structure 211, the third N+ doped region 215 being interposed between the first P+ doped region 214 and the gate structure 211. The gate structure 211 may enable collective operation of the third N+ doped region 215 and first P+ doped region 214 which, as shown, collectively correspond to a source of the HV NMOS 102.

A second P-type well 307 may be further disposed adjacent to the N-type well region 208. As shown, the N-type well region may encompass the first and second P-type well regions 207, 307 such that a portion of the N-type well region 208 is interposed there between. The distance between the P-type well 207 and the P-type well 307 may be adjusted in order to adjust the pinch-off voltage of the embedded JFET. As shown, the second P-type well region may comprise a second P+ doped region 308 which corresponds to the isolated gate of the embedded JFET.

As shown in the cross-sectional view along line A-A', a third P-type well region 305 may further be disposed adjacent to the N-type well region 208 and the P-type substrate 201. As shown, the third P-type well region 305 may have a third P+ doped region 309-disposed thereon which may correspond to the body or bulk of the embedded JFET 101. As will be more easily appreciated by referring back to FIG. 3b, a portion of the third P-type well region 305 may be interposed between the third P+ doped region 309 and the first N+ doped region 209. Further, a portion of the N-type well region 208 may be interposed between second 307 and third 305 and first 207 and third 305 P-type well regions.

FOX portions 216 may be further disposed adjacent to the N-type well region 208. For example, with reference to the cross-sectional view along line B-B', a first FOX portion may be disposed adjacent to a distal end of the first N+ doped region 209, a second FOX portion may be interposed between a distal end of the first N+ doped region 209 and a distal end of the second P+ doped portion 308, a third FOX portion may be interposed between a distal end of the second P+ doped portion 308 and a distal end of the first P+ portion 214, and a fourth FOX portion may be interposed between the first P-type well 207 and a distal end of the second N+ doped region 210 and further interposed between the gate structure 211 and the first P-type well 207. An N-type layer 213 and P-top portion 212 may also be further disposed adjacent to the N-type well region 208, the N-type layer 213 being interposed between the fourth FOX portion 216 and the P-top portion 212.

Figure 4A:
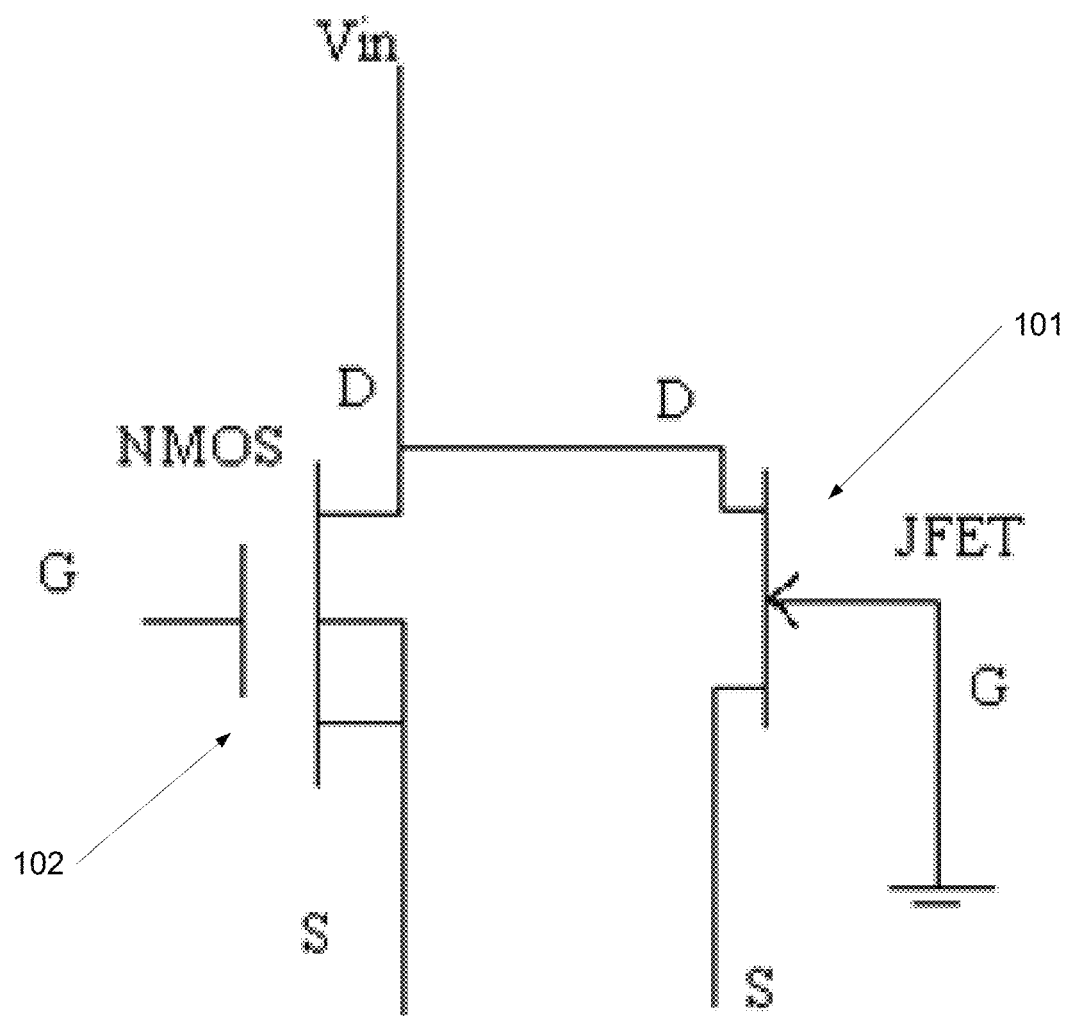
FIG. 4a illustrates an equivalent circuit representation in accordance with a third example embodiment of the present invention.
Figure 4B:
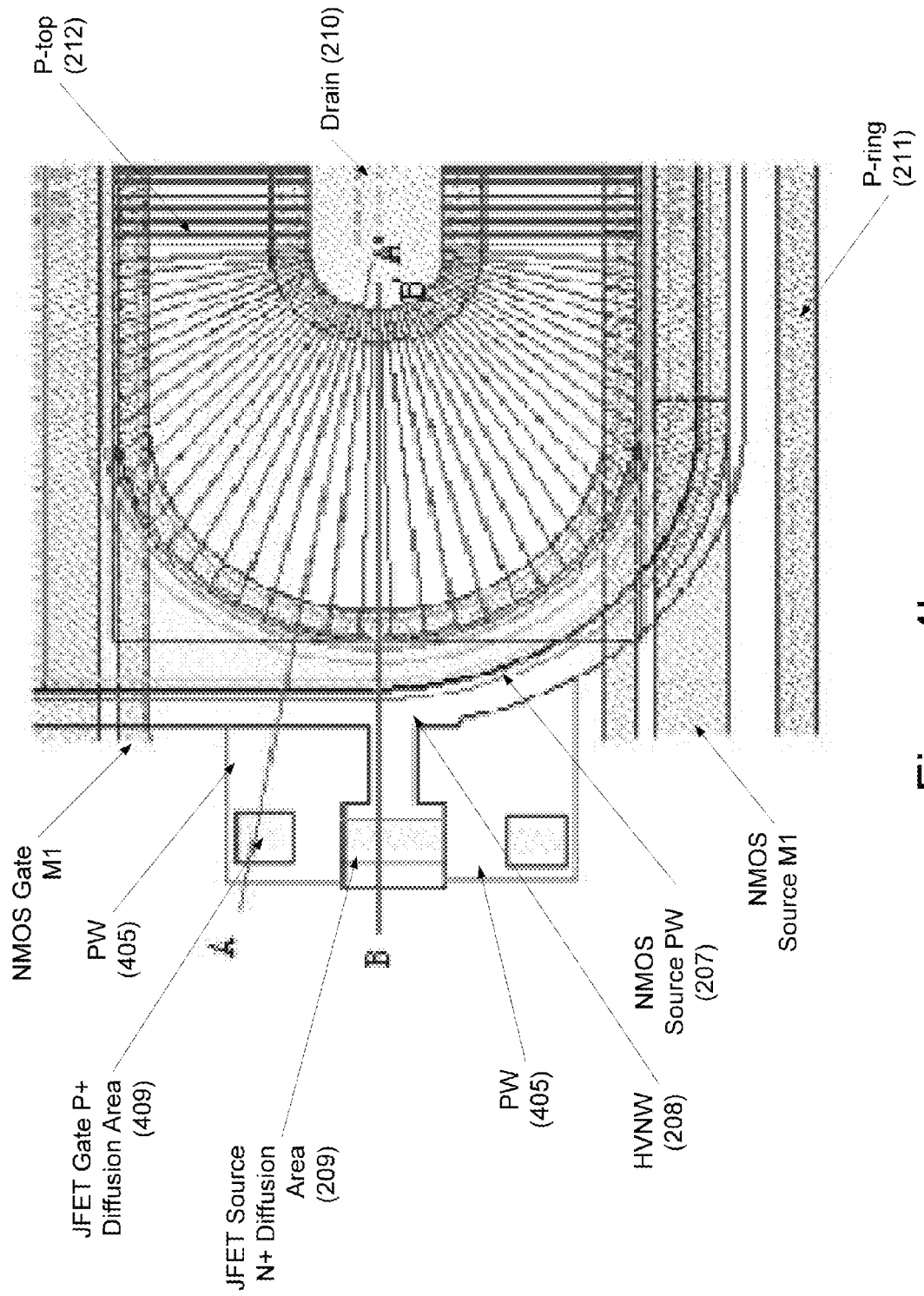
FIG. 4b illustrates a top view of a semiconductor device in accordance with the third example embodiment.

FIG. 4a depicts a block diagram of an equivalent circuit for a third example embodiment in which a gate (G) of the embedded JFET 101 is alone. FIG. 4b depicts a top view of an example layout of the second example embodiment in which the gate of the embedded JFET 101 is alone. Although only half of the NMOS 102 is shown in FIG. 3b, this example layout may also provide two embedded JFETs near the source end of the NMOS 102. To appreciate the structure of the embedded JFET 101 and how it fits with the structure of the NMOS, attention is now turned to FIG. 4c, in which two cross-sectional views taken along lines A-A' and B-B' of FIG. 4b are depicted.

Figure 4C:
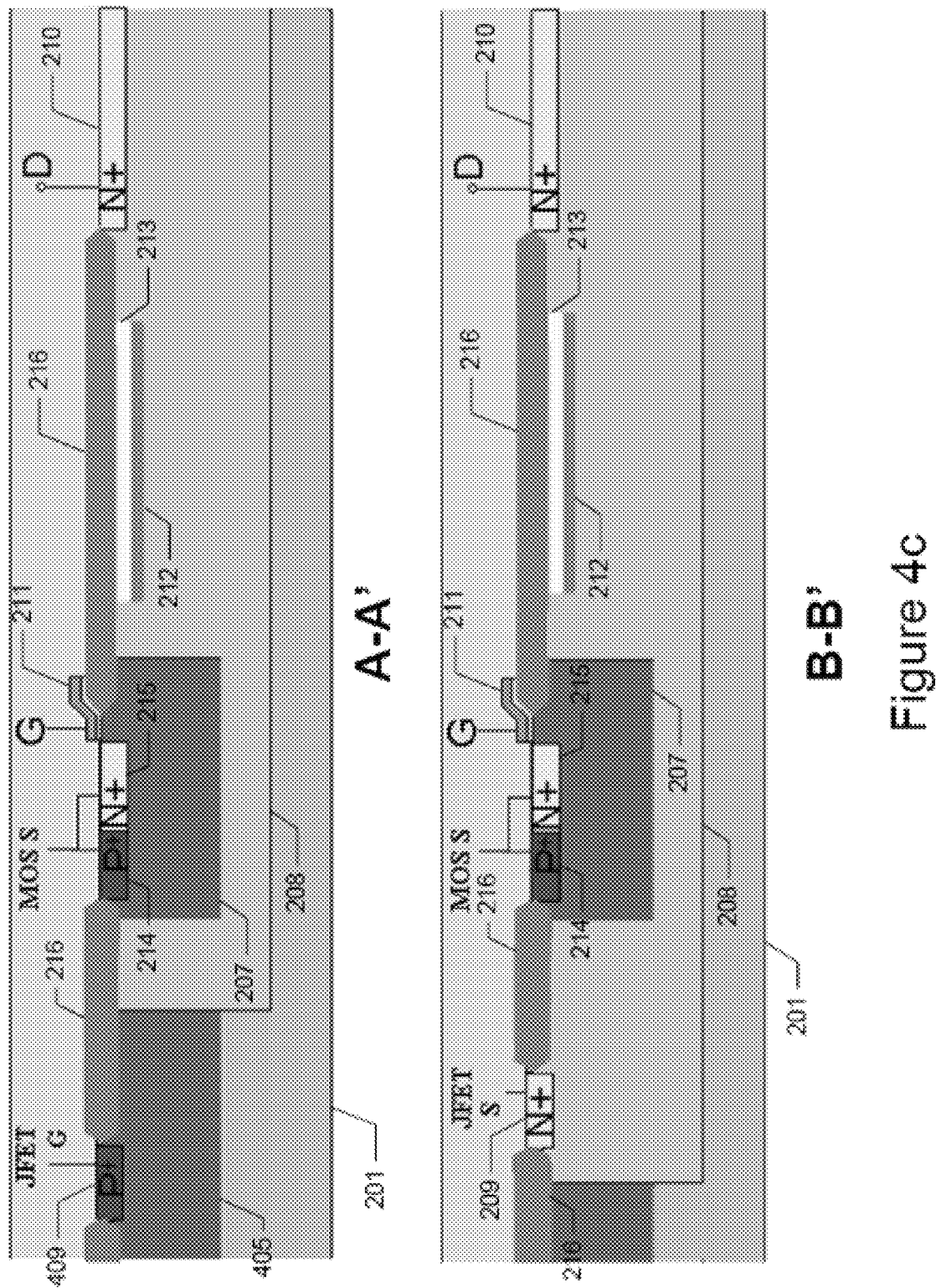
FIG. 4c illustrates two cross-sectional views of the semiconductor device depicted in FIG. 4b, taken along the lines A-A' and B-B'.

As can be seen from the cross-sectional view along line B-B' in FIG. 4c, a P-type material substrate 201 may be provided with an N-type region 208 disposed thereon according to the depicted example embodiment. As with the first embodiment depicted in FIG. 2c, a first P-type well region 207 may disposed adjacent to the N-type well region 208 and first and second N+ doped regions 209, 210 may be disposed adjacent to the N-type well region 208 and on opposing sides of the P-type well region 207. As shown, the first N+ doped region 209 corresponds to a source of the embedded JFET 101 while the second N+ doped region 210 corresponds to a drain of both the embedded JFET 101 and the NMOS 102. As further shown in FIG. 2c, the P-well region 207 may comprise a P+ doped region 214, a third N+ doped region 215, and a gate structure 211, the third N+ doped region 215 being interposed between the P+ doped region 214 and the gate structure 211. The gate structure 211 may enable collective operation of the third N+ doped region 215 and P+ doped region 214 which, as shown, collectively correspond to a source of the NMOS 102.

As shown in the cross-sectional view along line A-A', a second P-type well region 405 may further be disposed adjacent to the N-type well region 208 and the P-type substrate 201. As shown, the second P-type well region 405 may have a second P+ doped region 409 disposed thereon which may correspond to the gate of the embedded JFET 101. As will be more easily appreciated by referring back to FIG. 4b, a portion of the second P-type well region 405 may be interposed between the first P+ doped region 409 and the first N+ doped region 209. Continuing to refer to FIG. 4b, the distance between the "upper" P-type well region 405 and the "lower" P-type well region 405 (that is, the P-type well regions 405 on either side of the HVNW 208) can be adjusted in order to adjust the pinch-off voltage of the embedded JFET 101.

FOX portions 216 may be further disposed adjacent to the N-type well region 208. For example, a first FOX portion may be disposed adjacent to a distal end of the first N+ doped region 209, a second FOX portion may be interposed between a distal end of the first N+ doped region 209 and a distal end of the first P+ doped portion 214, and a third FOX portion may be interposed between the first P-type well and a distal end of the second N+ doped region 210 and further interposed between the gate structure 211 and the P-type well 207. An N-type layer 213 and P-top portion 212 may also be further disposed adjacent to the N-type well region 208, the N-type layer 213 being interposed between the third FOX portion 216 and the P-top portion 212.

Figure 5A:
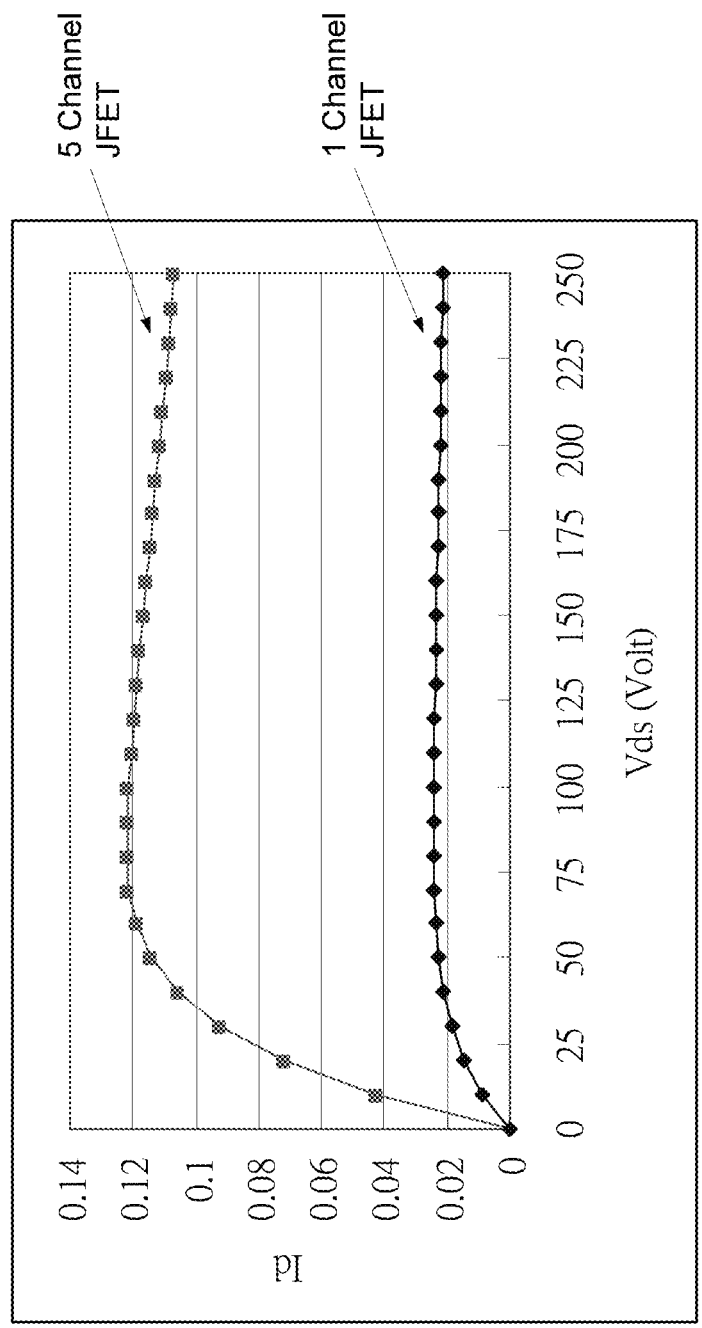
FIG. 5a illustrates a graph of electrical properties of a fourth example embodiment.
Figure 5B:
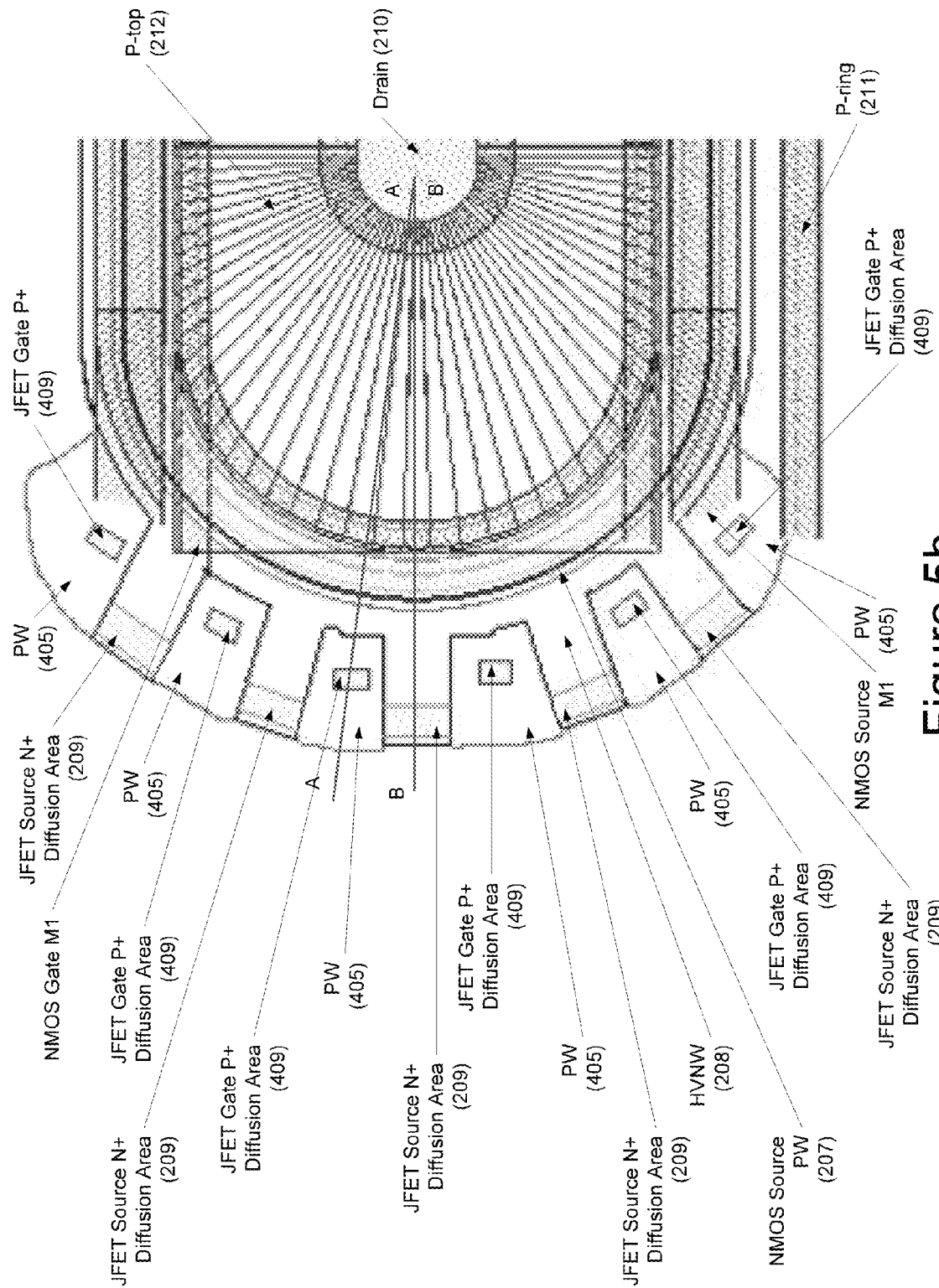
FIG. 5b illustrates a top view of a semiconductor device in accordance with the fourth example embodiment.
Figure 5C:
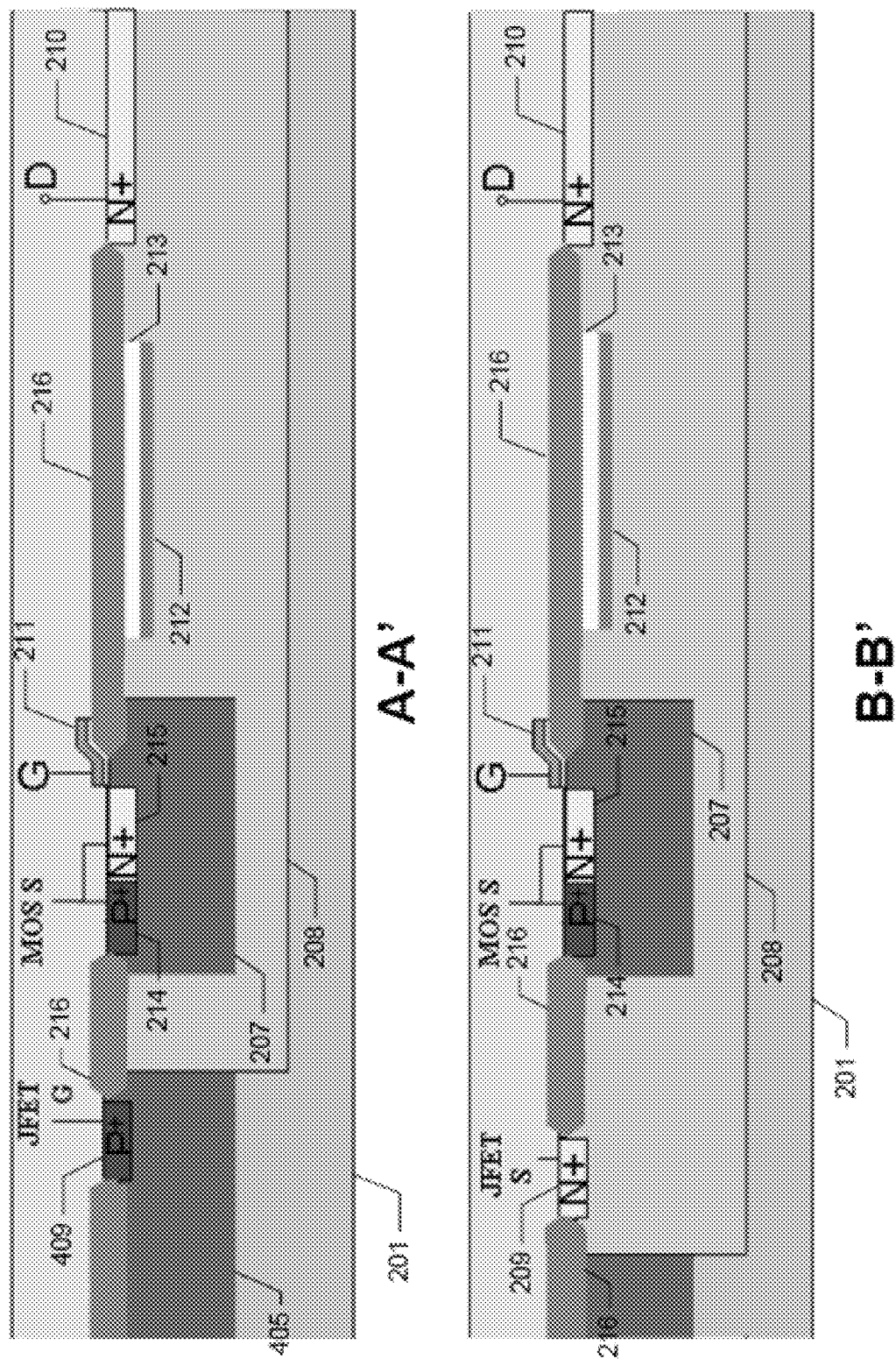
FIG. 5c illustrates two cross-sectional views of the semiconductor device depicted in FIG. 5b, taken along the lines A-A' and B-B'.

Referring now to FIGS. 5a, 5b, and 5c, the third example embodiment in which a gate of the embedded JFET 101 is alone may form the basis of a multi-channel embedded JFET structure, which can increase the JFET drain current. For example, FIG. 5a depicts a comparison between the drain current of a five-channel JFET versus a single-channel JFET. As shown, the five-channel JFET structure may yield a drain current more than five times greater than the single-channel JFET structure at comparable Vds voltages. As shown in FIG. 5b, the multi-channel embedded JFET structure may be provided by reproducing the structure of the single-channel alone gate embedded JFET depicted in FIG. 4b along the circumference of the NMOS. Indeed, as can be seen in the A-A' and B-B' cross-sectional views depicted in FIG. 5c, the internal structure is nearly identical to that of the single-channel alone gate embedded JFET depicted in FIG. 4c. Certain example embodiments, however, may exhibit differences, such as in the placement of the second P+ doped portions 409 which, as depicted in FIGS. 5b and 5c, may, for example, be inwardly offset.

Figure 6A:
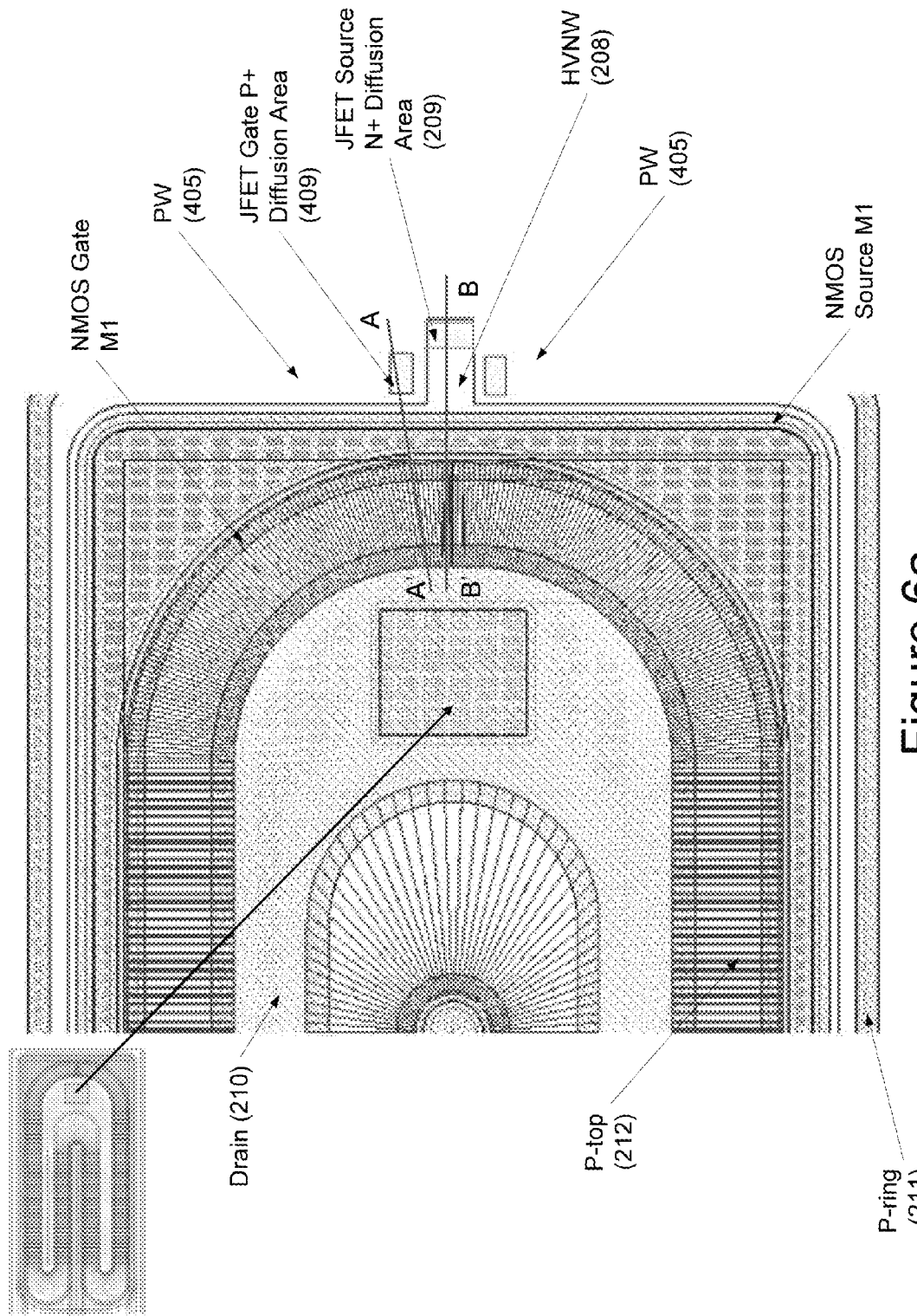
FIG. 6a illustrates a top view of a semiconductor device in accordance with a fifth example embodiment.
Figure 6B:
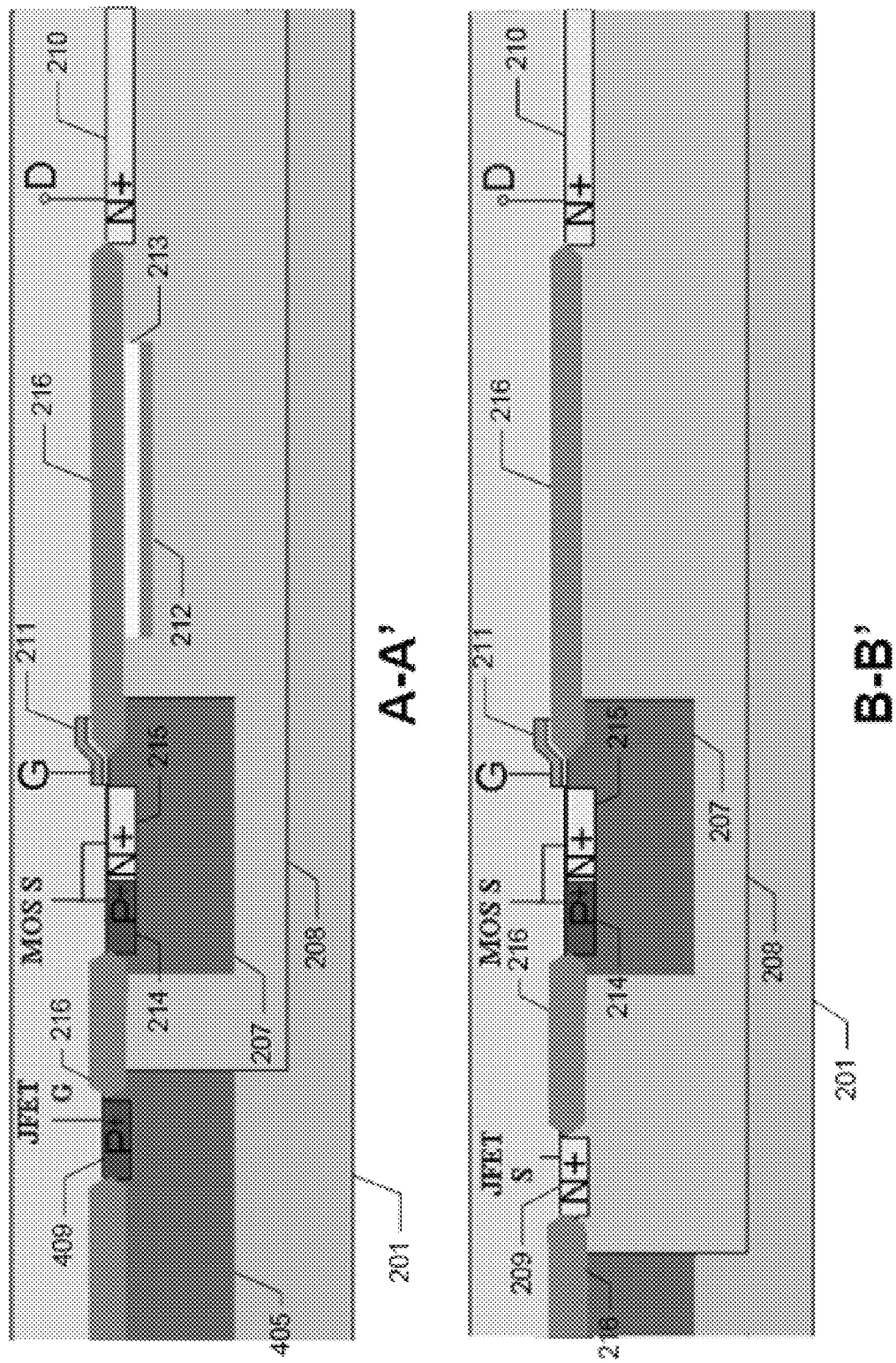
FIG. 6b illustrates two cross-sectional views of the semiconductor device depicted in FIG. 6a, taken along the lines A-A' and B-B'.

FIGS. 6a and 6b depict an additional variation of the alone gate embedded JFET of FIGS. 4b and 4c. In this example embodiment, the embedded JFET is formed adjacent to the NMOS drain 210 instead of adjacent to the NMOS source. As can be seen from FIGS. 6a and 6b, there may be little to no significant structural difference between a drain-side embedded JFET and the source-side embedded JFETs discussed above.

The N-type well region 208 of example embodiments may be formed by an N-type well, an N-type drift layer, an N-type buffer layer, an N-type deep well. The P-type well regions of example embodiments may be stacked with a P-type well and P+ buried layer or a P-implant. The N-type well region 208 of example embodiments may also be an N-implant in some cases.

Example embodiments may therefore provide a relatively small-sized JFET, such as an NJFET or HV NJFET, embedded in an NMOS, such as an HV NMOS. Moreover, example embodiments may be applied to a standard HV process without a requirement for use of additional masks or processes. As such, circuits which may include both a JFET and NMOS, such as, for example, buck conversion circuit, may benefit from the reduced circuit footprint provided by the NMOS embedded JFET structure provided herein.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A semiconductor device comprising:
   a P-type substrate; an N-type well region disposed adjacent to the substrate;
   a P-type well region disposed adjacent to the N-type well region; and
   first and second N+ doped regions disposed adjacent to the N-type well region and on opposing sides of the P-type well region;
   wherein the P-type well region comprises a P+ doped region, a third N+ doped region and a gate structure, the third N+ doped region being interposed between the P+ doped region and the gate structure.

2. The semiconductor device of claim 1, wherein the P-type well region is a first P-type well region, and further comprising a second P-type well region, the N-type well region encompassing the first and second P-type well regions such that at least a portion of the N-type well region is interposed between the first and second P-type well regions.

3. The semiconductor device of claim 1, further comprising first, second, and third field oxide (FOX) portions disposed adjacent to the N-type well region, the first FOX portion being further disposed adjacent to the first N+ doped region, the second FOX portion being further interposed between the first N+ doped region and the P+ doped portion, and the third FOX portion being interposed between the P-type well region and the second N+ doped region and further interposed between the gate structure and the P-type well region.

4. The semiconductor device of claim 3, further comprising an N-type layer and a P-top layer disposed adjacent to the N-type well region, the N-type layer being interposed between the third FOX portion and the P-top portion.

5. The semiconductor device of claim 3, further comprising an additional P-type well region disposed adjacent to the N-type well region and interposed between the first FOX portion and the P-type substrate.

6. The semiconductor device of claim 1, wherein a source of a junction gate field-effect transistor (JFET) is associated with the first N+ doped region, a drain of the JFET is associated with the second N+ doped region, and a gate of the JFET is associated with the P+ doped region and the third N+ doped region.

7. The semiconductor device of claim 6, wherein a source of an n-channel metal-oxide field effect transistor (NMOS) is associated with the P+ doped region and the third N+ doped region, and a drain of the NMOS is associated with the second N+ doped region.

8. A method for manufacturing a semiconductor device comprising:
providing a P-type substrate;
providing an N-type well region disposed adjacent to the substrate;
providing a P-type well region disposed adjacent to the N-type well region; and
providing first and second N+ doped regions disposed adjacent to the N-type well region and on opposing sides of the P-type well region;
wherein the P-type well region comprises a P+ doped region, a third N+ doped region and a gate structure, the third N+ doped region being interposed between the P+ doped region and the gate structure.

9. The method of claim 8, wherein providing the P-type well region comprises providing a first P-type well region, and further comprising providing a second P-type well region, the N-type well region encompassing the first and second P-type well regions such that at least a portion of the N-type well region is interposed between the first and second P-type well regions.

10. The method of claim 8, further comprising providing first, second, and third field oxide (FOX) portions disposed adjacent to the N-type well region, the first FOX portion being further disposed adjacent to the first N+ doped region, the second FOX portion being further interposed between the first N+ doped region and the P+ doped portion, and the third FOX portion being interposed between the P-type well region and the second N+ doped region and further interposed between the gate structure and the P-type well region.

11. The method of claim 10, further comprising providing an N-type layer and a P-top layer disposed adjacent to the N-type well region, the N-type layer being interposed between the third FOX portion and the P-top portion.

12. The method of claim 10, further comprising providing an additional P-type well region disposed adjacent to the N-type well region and interposed between the first FOX portion and the P-type substrate.

13. The method of claim 8, wherein a source of a junction gate field-effect transistor (JFET) is associated with the first N+ doped region, a drain of the JFET is associated with the second N+ doped region, a gate of the JFET is associated with the P+ doped region and the third N+ doped region, a source of an n-channel metal-oxide field effect transistor (NMOS) is associated with the P+ doped region and the third N+ doped region, and a drain of the NMOS is associated with the second N+ doped region.

14. A semiconductor device comprising:
a P-type substrate;
an N-type well region disposed adjacent to the substrate;
a first P-type well region disposed adjacent to the N-type well region,
a second P-type well region disposed adjacent to the N-type well region and the substrate, the N-type well region encompassing the first P-type well region such that at least a portion of the N-type well region is interposed between the first and second P-type well regions; and
first and second N+ doped regions disposed adjacent to the N-type well region and on opposing sides of the first P-type well region;
wherein the second P-type well region comprises a second P+ doped region and the first P-type well region comprises a first P+ doped region, a third N+ doped region and a gate structure, the third N+ doped region being interposed between the P+ doped region and the gate structure; and
further wherein at least a portion of the second P-type well region is interposed between the first P+ doped region and the first N+ doped region.

15. The semiconductor device of claim 14, further comprising a field oxide (FOX) portion disposed adjacent to the N-type well region and interposed between the first P-type well region and the second N+ doped region and further interposed between the gate structure and the first P-type well region.

16. The semiconductor device of claim 15, further comprising an N-type layer and a P-top layer disposed adjacent to the N-type well region, the N-type layer being interposed between the FOX portion and the P-top portion.

17. The semiconductor device of claim 14, further comprising a third P-type well region comprising a third P+ doped region, the third P-type well region being disposed adjacent to the N-type well region and the substrate such that at least a portion of the third P-type well region is interposed between the third P+ doped region and the first N+ doped region.

18. The semiconductor device of claim 14, wherein a source of a junction gate field-effect transistor (JFET) is associated with the first N+ doped region, a drain of the JFET is associated with the second N+ doped region, and a gate of the JFET is associated with the second P+ doped region.

19. The semiconductor device of claim 18, wherein a source of an n-channel metal-oxide field effect transistor (NMOS) is associated with the first P+ doped region and the third N+ doped region and a drain of the NMOS is associated with the second N+ doped region.

20. The semiconductor device of claim 17, further comprising:
fourth, fifth, sixth, and seventh P-type well regions respectively comprising fourth, fifth, sixth, and seventh P+ doped regions; and
fourth, fifth, sixth, and seventh N+ doped regions disposed adjacent to the N-type well region, the fourth, fifth, sixth, and seventh N+ doped regions being disposed on an opposing side of the second P-type region from the second N+ doped region;
wherein the fourth N+ doped region is interposed between the second and fourth P-type well regions, the fifth N+ doped region is interposed between the fourth and fifth P-type well regions, the sixth N+ doped region is interposed between the fifth and sixth P-type well regions, and the seventh N+ doped region is interposed between the sixth and seventh P-type well regions.

* * * * *